(12) United States Patent
Yu et al.

(10) Patent No.: US 9,048,145 B2
(45) Date of Patent: Jun. 2, 2015

(54) ARRAY SUBSTRATE, METHOD FOR MANUFACTURING THE SAME, AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Haifeng Yu, Beijing (CN); Bin Feng, Beijing (CN); Hongtao Lin, Beijing (CN)

(73) Assignees: BOE Technology Group Co., Ltd. (CH); Beijing BOE Display Technology Co., Ltd. (CH)

( * ) Notice: Subject to any disclaimer, the term of this patent is extended or adjusted under 35 U.S.C. 154(b) by 0 days.

(21) Appl. No.: 14/057,267

(22) Filed: Oct. 18, 2013

(65) Prior Publication Data

US 2014/0167051 A1    Jun. 19, 2014

(30) Foreign Application Priority Data

Dec. 14, 2012   (CN) .......................... 2012 1 0546103

(51) Int. Cl.
| | |
|---|---|
| *H01L 21/336* | (2006.01) |
| *H01L 29/10* | (2006.01) |
| *H01L 27/12* | (2006.01) |
| *H01L 29/737* | (2006.01) |

(Continued)

(52) U.S. Cl.
CPC .......... *H01L 27/124* (2013.01); *H01L 27/1214* (2013.01); *H01L 29/7371* (2013.01); *G02F 1/1362* (2013.01); *H01L 27/0288* (2013.01)

(58) Field of Classification Search
CPC .................... H01L 27/1214; H01L 29/7371
USPC ....................... 257/59, 71; 438/197
See application file for complete search history.

(56) References Cited

U.S. PATENT DOCUMENTS

| | | | |
|---|---|---|---|
| 5,068,748 A | 11/1991 | Ukai | |
| 5,945,711 A * | 8/1999 | Takemura et al. | 257/344 |

(Continued)

FOREIGN PATENT DOCUMENTS

| | | |
|---|---|---|
| CN | 1617351 | 5/2005 |
| CN | 1979816 | 6/2007 |
| CN | 202977423 | 6/2013 |

OTHER PUBLICATIONS

Text of the Notification of the Second Office Action, App. No. 2012105461039, Dec. 31, 2014.

(Continued)

*Primary Examiner* — Fernando L Toledo
*Assistant Examiner* — Neil Prasad
(74) *Attorney, Agent, or Firm* — Baker Hostetler LLP

(57) ABSTRACT

Disclosed is a method for manufacturing an array substrate, comprising: step A, sequentially forming patterns of a first conduction layer, source and drain electrodes, an active layer, and an insulation layer on one side of the substrate, wherein at least one via hole is provided on the insulation layer; step B, sequentially forming a gate metal layer and a passivation layer on the substrate on which the first conduction layer, the source and drain electrodes, the active layer, and the insulation layer have been formed, wherein the gate metal layer comprises a gate electrode and a gate line, and the gate metal layer is coupled to the first conduction layer through the at least one via hole to form a path for dispersing static electricity.

14 Claims, 4 Drawing Sheets

(51) Int. Cl.
  *G02F 1/1362* (2006.01)
  *H01L 27/02* (2006.01)

(56) References Cited

U.S. PATENT DOCUMENTS 6,198,133 B1 * 3/2001 Yamazaki et al. ............ 257/347
7,019,385 B1 * 3/2006 Zhang et al. .................. 257/640
2007/0273802 A1 * 11/2007 Nakamura ..................... 349/40

OTHER PUBLICATIONS

Notification of First Office Action, App. No. 201210546103.9, Issue Ser. No. 2014051200902170; Issue Date: May 25, 2014.

* cited by examiner

ARRAY SUBSTRATE, METHOD FOR MANUFACTURING THE SAME, AND DISPLAY APPARATUS

CROSS-REFERENCE TO RELATED APPLICATIONS

The present application claims priority to Chinese Patent Application No. 201210546103.9 filed before the Chinese Patent Office on Dec. 14, 2012 and entitled "ARRAY SUBSTRATE, METHOD FOR MANUFACTURING THE SAME, AND DISPLAY APPARATUS", which is incorporated herein by reference in its entirety.

BACKGROUND OF THE INVENTION

1. Field of the Invention

Embodiments of the present Invention relate to the technical field of displaying, and more particularly to an array substrate, a method for manufacturing the same, and a display apparatus.

2. Description of the Prior Art

Advanced Super Dimension Switch (ADS) generates a multi-dimensional electric field by using an electric field generated by the same slit electrode edge and an electric field generated between a slit electrode layer and a plate electrode layer, so that each of all oriented liquid crystal molecules among the slit electrodes in a liquid crystal box and just above the electrodes is capable of rotating. In this way, the operation efficiency of the liquid crystals is improved and the light transmission efficiency is enhanced. The ADS is capable of improving the display quality of a Thin Film Transistor-Liquid Crystal Display (TFT-LCD) product, and has such advantages as high resolution, high transmittance, low power consumption, wide viewing angle, high aperture ratio, low chromatic aberration, and no posh Mura and so on.

Compared with other displays, an ADS LCD has the advantage of widening the view angle, and stands at an important position in the current flat panel display market. However, For an ADS LCD, the array substrate and the process for manufacturing the array substrate may determine the performance and the price of the ADS LCD product. In the Array segment process within the traditional process, on the array substrate, an antistatic Electro-Static discharge (ESD) component loop is formed along with TFT deposition in a pixel area simultaneously. However, the ESD loop is usually formed during a later stage of the Array process (after the deposition of the pixel electrodes). Therefore, the ESD component may not bring its function of antistatic into play during the Array process, which leads to various undesired effects caused by static electricity during this stage.

SUMMARY OF THE INVENTION

To solve the above technical problem, embodiments of the present invention provide an array substrate, a method for manufacturing the same, and a display apparatus, which enable an ESD component to give full play to its function in dispersing electric charges, and effectively reduce the occurrence of the ESD.

According to an aspect of the present invention, a method for manufacturing an array substrate is provided, comprising: step A: sequentially forming patterns of a first conduction layer, source and drain electrodes, an active layer, and an insulation layer on one side of the substrate, wherein at least one via hole is provided on the insulation layer; and step B: sequentially forming a gate metal layer and a passivation layer on the substrate on which the first conduction layer, the source and drain electrodes, the active layer, and the insulation layer have been formed, wherein the gate metal layer comprises a gate electrode and a gate line, and the gate metal layer is coupled to the first conduction layer through the at least one via hole to form a path for dispersing static electricity.

According to another aspect of the present invention, an array substrate is provided, comprising: a substrate; patterns of a first conduction layer, source and drain electrodes, an active layer, and an insulation layer, wherein the patterns are sequentially formed on one side of the substrate, wherein at least one via hole is provided on the insulation layer; a gate metal layer and a passivation layer that are sequentially formed on the substrate on which the first conduction layer, the source and drain electrodes, the active layer, and the insulation layer have been formed, wherein the gate metal layer comprises a gate electrode and a gate line, and the gate metal layer is coupled to the first conduction layer through the at least one via hole to form a path for dispersing static electricity.

According to another aspect of the present invention, a display apparatus is provided, comprising the array substrate as described above.

It can be seen from the above technical solutions that the embodiments of the present invention can achieve the following beneficial effects: the ESD loop may be formed in advance during the Array process, enabling an ESD component to give full play to its function in dispersing electric charges; and the occurrence of the ESD is effectively reduced and electrical defects caused by the ESD are also effectively reduced.

DETAILED DESCRIPTION OF THE PREFERRED EMBODIMENTS

Figure 1:
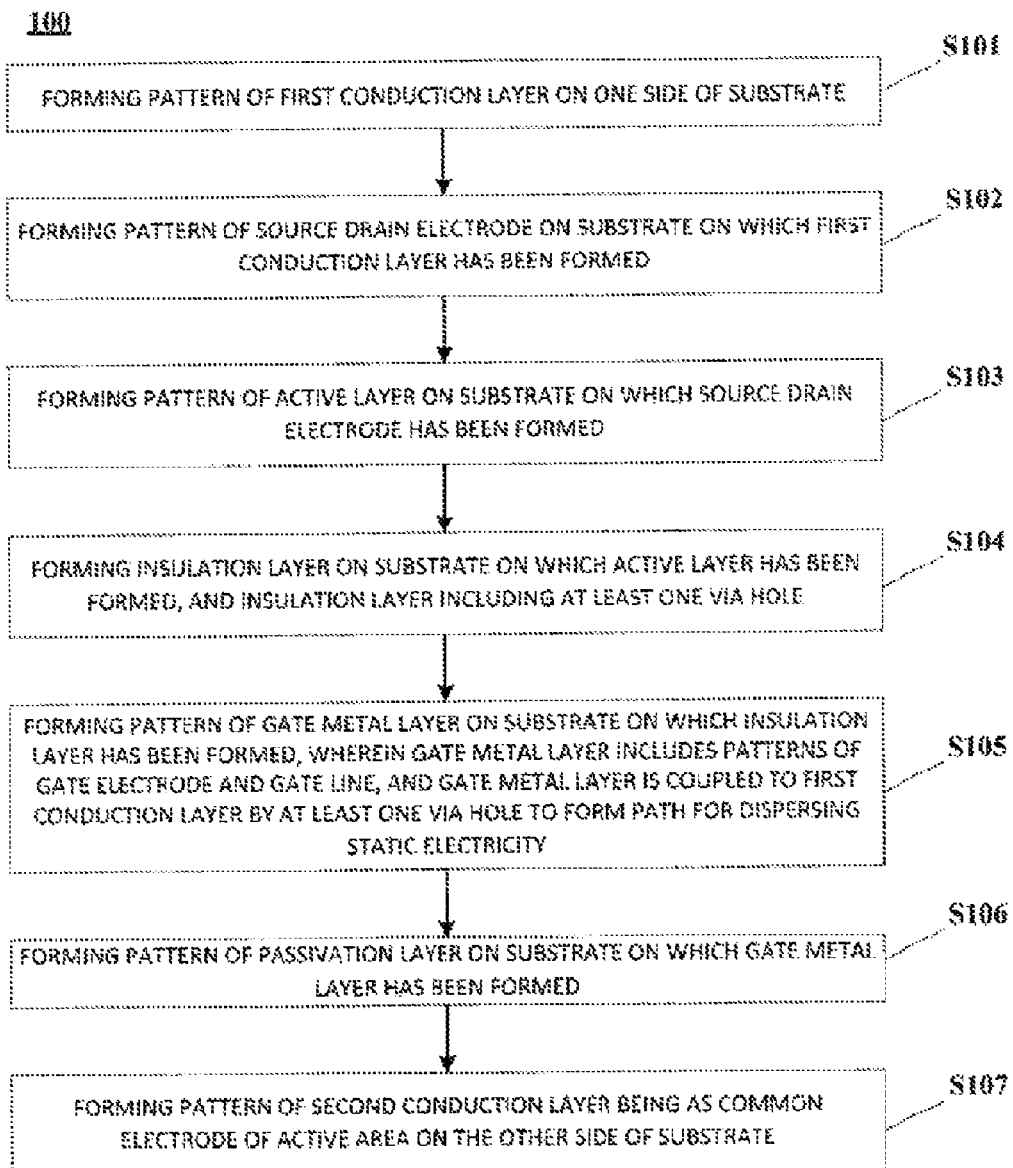
FIG. 1 is a flow chart of a method for manufacturing an array substrate according to an embodiment of the present invention.
Figure 2:
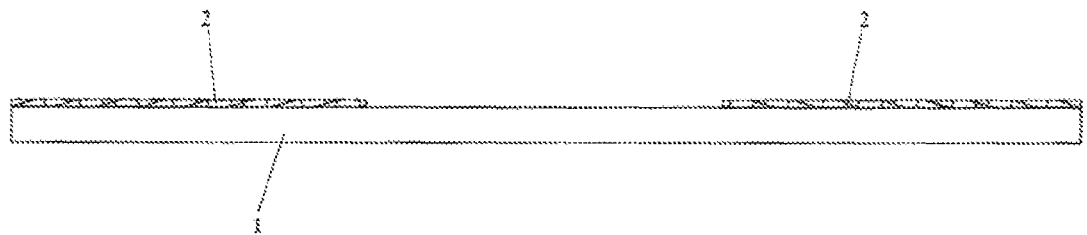
FIG. 2 is a schematic section view of an array substrate after the execution of step S101 in the method as illustrated in FIG. 1.
Figure 3:
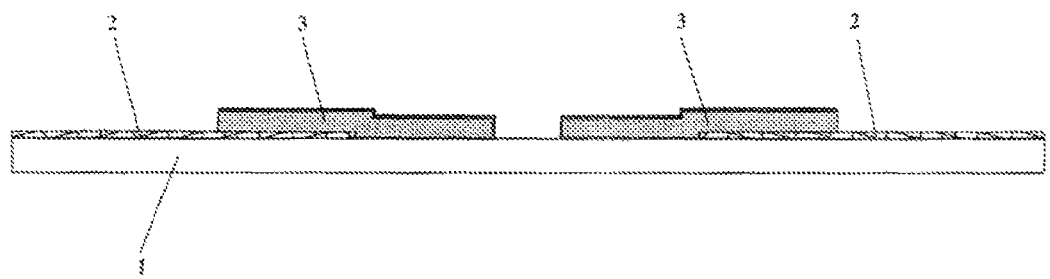
FIG. 3 is a schematic section view of the array substrate after the execution of step S102 in the method as illustrated in FIG. 1.
Figure 4:
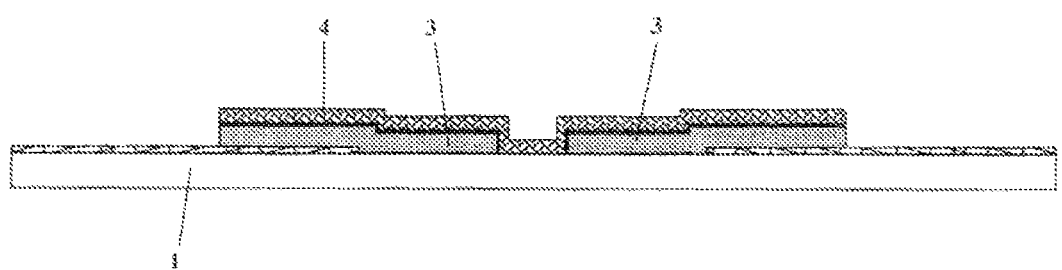
FIG. 4 is a schematic section view of the array substrate after the execution of step S103 in the method as illustrated in FIG. 1.
Figure 5:
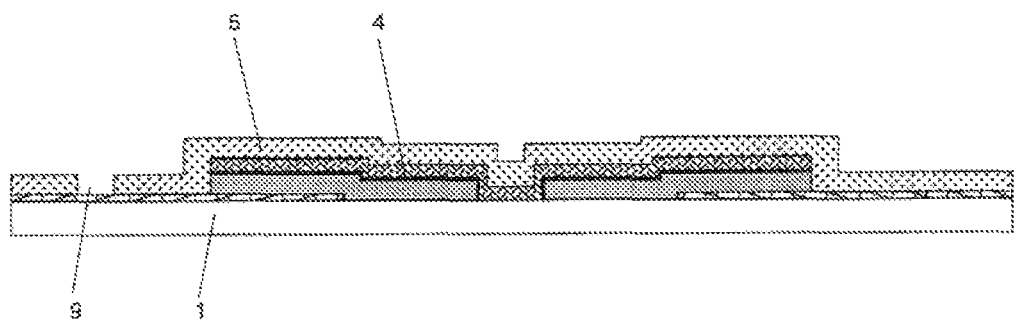
FIG. 5 is a schematic section view of the array substrate after the execution of step S104 in the method as illustrated in FIG. 1.
Figure 6:
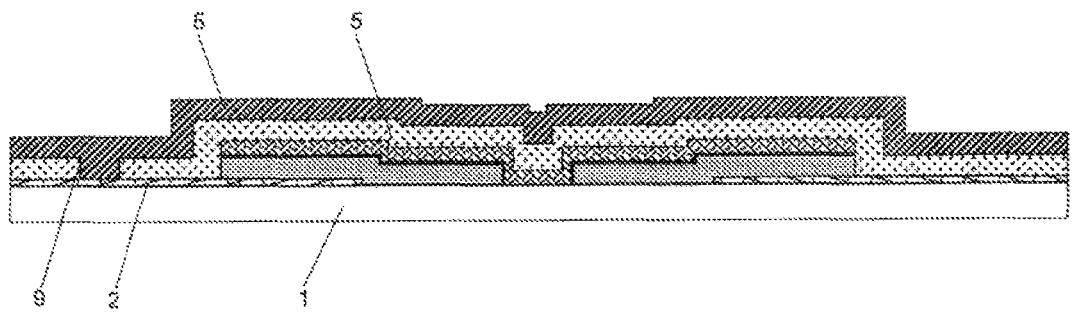
FIG. 6 is a schematic section view of the array substrate after the execution of step S105 in the method as illustrated in FIG. 1.
Figure 7:
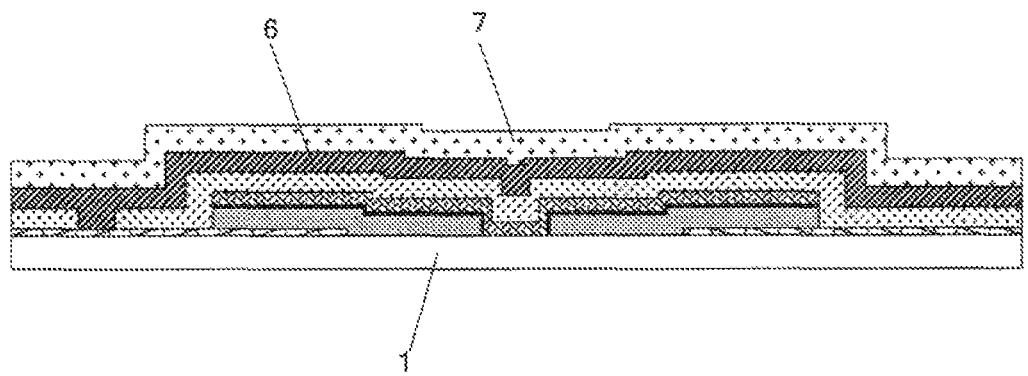
FIG. 7 is a schematic section view of the array substrate after the execution of step S106 in the method as illustrated in FIG. 1.
Figure 8:
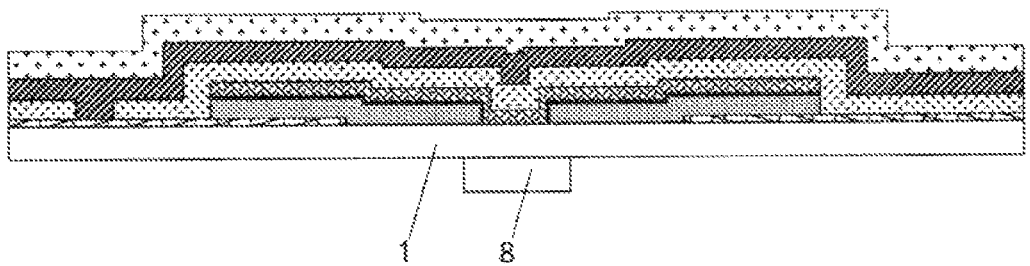
FIG. 8 is a schematic section view of the array substrate after the execution of step S107 in the method as illustrated in FIG. 1.

To make the objective, technical solutions, and advantages of embodiments of the present invention clearer, the following describes the embodiments of the present invention with reference to the accompanying drawings. Herein, the exemplary embodiments are merely for illustrating the present invention, but are not intended to limit the scope of the present invention.

In the existing TFT-LCD process, the ESD component effectively functions to evenly spread the electric charges generated during the manufacturing process. However, a traditional ESD loop may only be formed after the deposition of an indium tin oxide (ITO) layer (i.e., after the completion of the Array process), and thus the ESD component is unable to function to spread the electric charges during the Array process. In the embodiments of the present invention, using an ADS mode product for example, a deposition sequence of source and drain electrodes, an active layer, and a gate metal layer is changed, and an ESD loop may be formed in advance as compared with the traditional Array process, thereby effectively reducing the damage to the film layer and pixels caused by the ESD during the Array segment.

According to art embodiment of the present invention, firstly, patterns of a first conduction layer, source and drain electrodes, an active layer, and an insulation layer are sequentially formed on one side of the substrate, wherein at least one via hole is provided on the insulation layer; then a gate metal layer and a passivation layer are sequentially formed on the substrate on which the insulation layer has been formed, wherein the gate metal layer comprises a gate electrode and a gate line, and the gate metal layer is coupled to the first conduction layer through the at least one via hole to form a path for dispersing static electricity.

Specifically, the procedure of a method 100 for manufacturing an array substrate will be described with reference to to FIG. 1 to FIG. 8 according to an embodiment of the present invention. The method 100 may comprise the following steps:

step S101: forming a pattern of a first conduction layer 2 on one side of a substrate 1;

step S102: forming patterns of source and drain electrodes 3 on the substrate 1 on which the first conduction layer 2 has been formed;

step S103: forming a pattern of an active layer 4 on the substrate 1 on which the source and drain electrodes 3 have been formed;

step S104: forming a pattern of an insulation layer 5 on the substrate 1 on which the active layer 4 has been formed, wherein the insulation layer 5 comprises at least one via hole 9;

step S105: forming a pattern of a gate metal layer 6 on the substrate 1 on which the insulation layer 5 has been formed, wherein the gate metal layer 6 comprises a gate electrode and a gate line, and the gate metal layer 6 is coupled to the first conduction layer 2 through the at least one via hole 9 to form a path for dispersing static electricity;

step S106: forming a pattern of a passivation layer 7 on the substrate 1 on which the gate metal layer 6 has been formed; and step S107: forming a pattern of a second conduction layer 8 which serves as a common electrode of an active display area (AA) on the other side of the substrate 1.

According to an embodiment of the present invention, the first conduction layer 2 and the second conduction layer 8 are made of a transparent conductive material. Alternatively, the transparent conductive material is indium tin oxide.

According to the embodiments of the present invention, the effect of forming in advance the ESD loop for preventing the static electricity in the TFT-LCD process is achieved by changing the deposition sequence of each film layer and etching steps in the Array process, thereby solving the technical problem that the ESD frequently occurs because the ESD component is formed only in the later stage of the Array process, and is not able to give play to its function as early as possible.

Specifically, firstly, the ESD loop is implemented in advance, and the damage to the product caused by the static electricity is effectively reduced. Furthermore, the ITO may be selected for the material of the metal layer at the bottom of the via hole 9, which is more stable and difficult to be oxidized compared with a traditional metal. Secondly, the metal deposited in the via hole 9 is superior over the ITO deposited at the traditional via hole in terms of conductivity. Last, the number of the via holes is significantly reduced as compared with the traditional process, and thus the defect rate caused by poor contact at the via holes is reduced.

Figure 9:
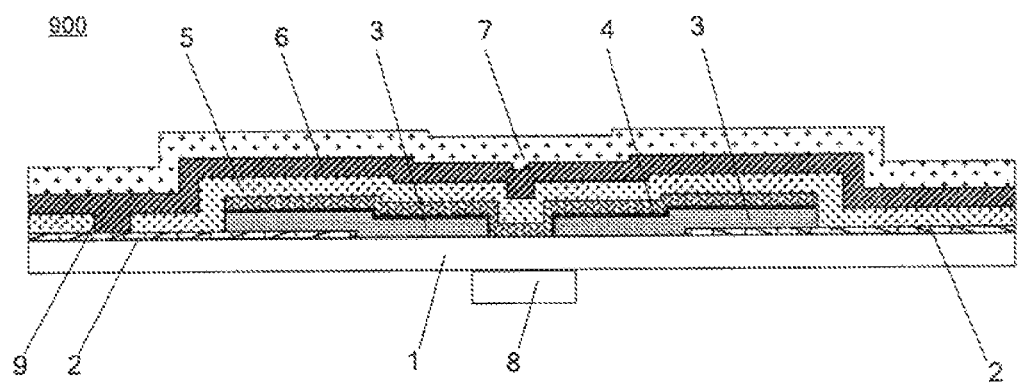
FIG. 9 is a schematic structural view of an array substrate according to an embodiment of the present invention.

Referring to FIG. 9, a structure diagram of an array substrate 900 according to an embodiment of the present invention is illustrated. The array substrate 900 may comprise:

a substrate 1;

patterns of a first conduction layer 2, source and drain electrodes 3, an active layer 4, and an insulation layer 5, wherein the patterns are sequentially formed on one side of the substrate 1, and at least one via hole 9 is provided on the insulation layer 5;

a gate metal layer 6 and a passivation layer 7 that are sequentially formed on the substrate 1 on which the insulation layer 5 has been formed, wherein the gate metal layer 6 comprises a gate electrode and a gate line, and the gate metal layer 6 is coupled to the first conduction layer 2 by the at least one via hole 9 to form a path for dispersing static electricity.

According to another embodiment of the present invention, a pattern of a second conduction layer 8 which serves as a common electrode of an active area may be formed on the other side of the substrate 1.

Alternatively, the first conduction layer 2 and the second conduction layer 8 may be made of a transparent conductive material. For example, the transparent conductive material may be ITO.

The embodiments of the present invention further provide a display apparatus comprising the array substrate as described above. The display apparatus may be any product or component having the display function, for example, but not limited to: an LCD panel, an electronic paper, an OLED panel, an LCD TV, an LCD, a digital photo frame, a mobile phone, or a tablet PC.

Detailed above are merely preferred embodiments of the present application. It should be noted that those ordinary skilled in the art may derive many modifications and polishes without departure from the principles of the present invention, and these modifications and polishes should also fall into the protection scope of the present application.

What is claimed is:

1. A method for manufacturing an array substrate, comprising:

step A: forming patterns of a first conduction layer, source and drain electrodes, an active layer, and an insulation layer in sequence on one side of the substrate, with the insulation layer coated on the active layer, the first conduction layer being in direct contact with one side of the array substrate and with the source and drain electrodes formed independent of the first conduction layer and located at least partially on the first conduction layer wherein at least one via hole is provided on the insulation layer for exposing the first conduction layer; and step B: sequentially forming a gate metal layer and a passivation layer on the substrate on which the first conduction layer, the source and drain electrodes, the active layer, and the insulation layer have been formed, wherein the gate metal layer comprises a gate electrode and a gate line, and the gate metal layer is directly coupled to the first conduction layer through the at least one via hole to form a path for dispersing static electricity.

2. The method according to claim 1, wherein the step A comprises:
step A1: forming the pattern of the first conduction layer on the side of the substrate;
step A2: forming the patterns of the source and drain electrodes on the substrate on which the first conduction layer has been formed;
step A3: forming the pattern of the active layer on the substrate on which the source and drain electrodes have been formed; and
step A4: forming the pattern of the insulation layer on the substrate on which the active layer has been formed, wherein the insulation layer comprises the at least one via hole.

3. The method according to claim 1, further comprising:
forming a pattern of a second conduction layer which serves as a common electrode of an active display area on the other side of the substrate.

4. The method according to claim 3, wherein the first conduction layer and the second conduction layer are made of a transparent conductive material.

5. The method according to claim 4, wherein the transparent conductive material is indium tin oxide.

6. An array substrate, comprising:
a substrate;
patterns of a first conduction layer in direct contact with one side of the substrate, source and drain electrodes formed independent of the first conduction layer and located at least partially on the first conduction layer, an active layer, and an insulation layer sequentially formed on one side of the substrate, wherein at least one via hole is provided on the insulation layer for exposing the first conduction layer; and
a gate metal layer and a passivation layer that are sequentially formed on the substrate on which the first conduction layer, the source and drain electrodes, the active layer, and the insulation layer have been formed, wherein the gate metal layer comprises a gate electrode and a gate line, and the gate metal layer is directly coupled to the first conduction layer through the at least one via hole to form a path for dispersing static electricity.

7. The array substrate according to claim 6, further comprising a pattern of a second conduction layer which is formed on the other side of the substrate and serves as a common electrode of an active display area.

8. The array substrate according to claim 7, wherein the first conduction layer and the second conduction layer are made of a transparent conductive material.

9. The array substrate according to claim 8, wherein the transparent conductive material is indium tin oxide.

10. A display apparatus, comprising the array substrate according to claim 6.

11. The method according to claim 2, further comprising:
forming a pattern of a second conduction layer which serves as a common electrode of an active display area on the other side of the substrate.

12. A display apparatus, comprising the array substrate according to claim 7.

13. A display apparatus, comprising the array substrate according to claim 8.

14. A display apparatus, comprising the array substrate according to claim 9.

* * * * *